United States Patent
Yu et al.

(10) Patent No.: US 11,855,057 B2
(45) Date of Patent: Dec. 26, 2023

(54) PACKAGE STRUCTURE AND METHOD OF FORMING THE SAME

(71) Applicant: Taiwan Semiconductor Manufacturing Company, Ltd., Hsinchu (TW)

(72) Inventors: Chi-Yang Yu, Taoyuan (TW); Yu-Min Liang, Taoyuan (TW); Jiun-Yi Wu, Taoyuan (TW); Chien-Hsun Lee, Hsin-chu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 103 days.

(21) Appl. No.: 17/371,090

(22) Filed: Jul. 8, 2021

(65) Prior Publication Data

US 2023/0009553 A1   Jan. 12, 2023

(51) Int. Cl.
*H01L 23/31* (2006.01)
*H01L 25/18* (2023.01)
*H01L 23/00* (2006.01)
*H01L 23/367* (2006.01)
*H01L 21/56* (2006.01)
*H01L 25/00* (2006.01)

(52) U.S. Cl.
CPC ............ *H01L 25/18* (2013.01); *H01L 21/568* (2013.01); *H01L 23/3107* (2013.01); *H01L 23/367* (2013.01); *H01L 24/24* (2013.01); *H01L 24/82* (2013.01); *H01L 25/50* (2013.01); *H01L 2224/24225* (2013.01); *H01L 2224/82101* (2013.01)

(58) Field of Classification Search
CPC ...... H01L 25/18; H01L 25/50; H01L 23/3107; H01L 23/367; H01L 24/24; H01L 24/82; H01L 21/568
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

(Continued)

*Primary Examiner* — Nathan W Ha
(74) *Attorney, Agent, or Firm* — JCIPRNET

(57) ABSTRACT

Provided are a package structure and a method of forming the same. The method includes: laterally encapsulating a device die and an interconnect die by a first encapsulant; forming a redistribution layer (RDL) structure on the device die, the interconnect die, and the first encapsulant; bonding a package substrate onto the RDL structure, so that the RDL structure is sandwiched between the package substrate and the device die, the interconnect die, and the first encapsulant; laterally encapsulating the package substrate by a second encapsulant; and bonding a memory die onto the interconnect die, wherein the memory die is electrically connected to the device die through the interconnect die and the RDL structure.

20 Claims, 12 Drawing Sheets

(56) References Cited

U.S. PATENT DOCUMENTS

| | | | | |
|---|---|---|---|---|
| 11,495,573 | B2* | 11/2022 | Tsai | H01L 24/19 |
| 2010/0246152 | A1* | 9/2010 | Lin | H01L 23/481 |
| | | | | 361/783 |
| 2018/0342474 | A1* | 11/2018 | Wu | H01L 21/486 |
| 2019/0181097 | A1* | 6/2019 | Cheah | H01L 23/552 |
| 2019/0294566 | A1* | 9/2019 | Park | G06F 13/28 |
| 2019/0393153 | A1* | 12/2019 | Wang | H01L 24/17 |
| 2020/0043853 | A1* | 2/2020 | Kim | H01L 24/81 |
| 2021/0066279 | A1* | 3/2021 | Yu | H01L 23/49811 |
| 2021/0125946 | A1* | 4/2021 | Huang | H01L 21/561 |
| 2021/0202392 | A1* | 7/2021 | Kung | H01L 24/20 |
| 2021/0225776 | A1* | 7/2021 | Wu | H01L 25/50 |
| 2021/0233852 | A1* | 7/2021 | Yu | H01L 23/5384 |
| 2021/0265308 | A1* | 8/2021 | Norman | G11C 5/025 |
| 2021/0271020 | A1* | 9/2021 | Islam | H01L 25/18 |
| 2022/0037255 | A1* | 2/2022 | Hwang | H01L 24/10 |
| 2022/0102256 | A1* | 3/2022 | Kwon | H01L 24/05 |
| 2022/0223529 | A1* | 7/2022 | Buot | H01L 23/5383 |
| 2022/0223530 | A1* | 7/2022 | Yu | H01L 23/481 |
| 2022/0223541 | A1* | 7/2022 | Lin | H01L 23/3107 |
| 2022/0278084 | A1* | 9/2022 | Ong | H01L 23/5385 |
| 2022/0278087 | A1* | 9/2022 | Wu | H01L 23/5385 |
| 2022/0302033 | A1* | 9/2022 | Cheah | H01L 23/5383 |
| 2022/0359482 | A1* | 11/2022 | Farooq | H01L 25/0652 |
| 2022/0367306 | A1* | 11/2022 | Chen | H01L 24/24 |
| 2022/0384307 | A1* | 12/2022 | Li | H01L 23/3735 |

\* cited by examiner

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
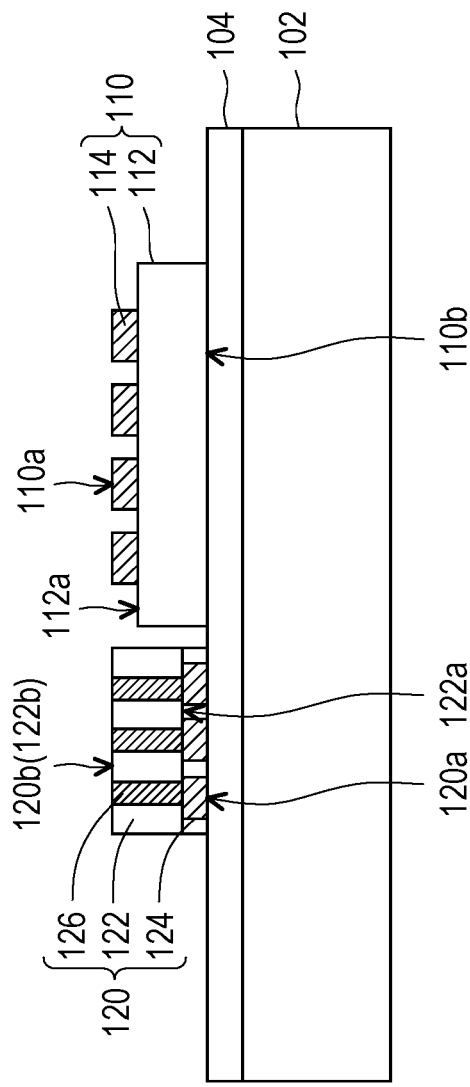
FIG. 1A to FIG. 1G are cross-sectional views of a method of forming a package structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views of a method of forming a package structure in accordance with a first embodiment.

Referring to FIG. 1A, this figure illustrates a cross-sectional view of mounting a device die 110 and an interconnect die 120 over a carrier 102 in an intermediate stage of forming a package structure in accordance with a first embodiment. According to some embodiments, the carrier 102 has a release film 104 coating the top surface of the carrier 102. In some embodiments, the carrier 102 is formed of a transparent material, and may be a glass carrier, a ceramic carrier, an organic carrier, or the like. The release film 104 may be formed of a Light-To-Heat-Conversion (LTHC) coating material applied to the carrier 102 in a coating process. Once applied, the LTHC coating material is capable of being decomposed under the heat of light/radiation (such as laser), and hence can release the carrier 102 from the structure formed thereon.

FIG. 1A further illustrates picking the device die 110 and the interconnect die 120, and then placing the device die 110 and the interconnect die 120 side by side on the release film 104. In some embodiments, the device die 110 has a front side (also referred to as an active surface) 110a and a backside 110b opposite to each other. The backside 100b of the device die 110 faces toward the carrier 102 while the active surface 110a of the device die 110 faces away from the carrier 102.

Specifically, the device die 110 (also referred to as first die) may include a substrate 112 and a plurality of contacts 114 distributed on an active surface 112a of the substrate 112. In some embodiments, the substrate 112 may be made of silicon or other semiconductor materials. For example, the substrate 112 may be a silicon substrate. Alternatively, or additionally, the substrate 112 may include other elementary semiconductor materials such as germanium. In some embodiments, the substrate 112 is made of a compound semiconductor such as silicon carbide, gallium arsenic, indium arsenide or indium phosphide. In some embodiments, the substrate 112 is made of an alloy semiconductor such as silicon germanium, silicon germanium carbide, gallium arsenic phosphide, or gallium indium phosphide. Furthermore, the substrate 112 may be a semiconductor on insulator such as silicon on insulator (SOI) or silicon on sapphire.

The contacts 114 are formed on the active surface 112a of the substrate 112 and electrically connected to the semiconductor devices (not shown) in and/or on the substrate 112. In some embodiments, the contacts 114 may include a conductive material such as copper, aluminum, gold, nickel, silver, palladium, tin, the like, or a combination thereof. In the present embodiment, the contacts 114 are metal pads, such as copper pads, hereinafter called "pads 114". Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The pads 114 are formed by physical vapor deposition (PVD) or electroplating, for example.

In some embodiments, the device die 110 includes a system on a chip or a system on chip (SoC) including several different integrated circuits, i.e., ICs or processors, together with memories and I/O interfaces. Each of the integrated circuit integrates various components of a computer or other electronic systems into one semiconductor chip. The various components contain digital, analog, mixed-signal, and often radio-frequency functions. Also, the SoC integrates processors (or controllers) with advanced peripherals like a graphics processing unit (GPU), a Wi-Fi module, or a co-processor. In the architecture of the SoC, both logic components and memory components are fabricated in the same silicon wafer. For high efficiency computing or mobile devices, multi-core processors are used, and the multi-core processors include large amounts of memories, such as several gigabytes. In some alternative embodiments, the device die 110 may be an application-specific integrated circuit (ASIC) die. In some other embodiments, the device die 110 may be a logic die.

As shown in FIG. 1A, the interconnect die 120 has a front surface 120a and a back surface 120b opposite to each other. The front surface 120a of the interconnect die 120 faces toward the carrier 102 while the back surface 120b of the interconnect die 120 faces away from the carrier 102. Specifically, the interconnect die 120 may include a substrate 122, a plurality of contacts 124, and a plurality of substrate-through vias (TSVs) 126. In some embodiments, the substrate 122 may be made of silicon or other semiconductor materials. For example, the substrate 122 may be a silicon substrate. Alternatively, or additionally, the substrate 122 may include other elementary semiconductor materials such as germanium. In some embodiments, the substrate 122 is made of a compound semiconductor such as silicon carbide, gallium arsenic, indium arsenide or indium phosphide. In some embodiments, the substrate 122 is made of an alloy semiconductor such as silicon germanium, silicon germanium carbide, gallium arsenic phosphide, or gallium indium phosphide. Furthermore, the substrate 122 may be a semiconductor on insulator such as silicon on insulator (SOI) or silicon on sapphire.

The contacts 124 are formed and distributed on a front surface 122a of the substrate 122 and electrically connected to the interconnect structure (not shown) in and/or on the substrate 122. In some embodiments, the contacts 124 may include a conductive material such as copper, aluminum, gold, nickel, silver, palladium, tin, the like, or a combination thereof. In the present embodiment, the contacts 124 are metal pads, such as copper pads, hereinafter called "pads 124". The pads 124 are formed by PVD or electroplating, for example.

The TSVs 126 penetrate through the substrate 122 to electrically connect to the pads 124 through the interconnect structure (not shown) in and/or on the substrate 122. In other words, the TSVs 126 extend from the front surface 122a of the substrate 122 to the back surface 122b of the substrate 122, thereby physically and/or electrically connecting the pads 124 respectively. In some embodiments, one of the TSVs 126 includes a conductive via and a diffusion barrier layer (not shown) surround the conductive via. The conductive via may include copper, copper alloys, aluminum, aluminum alloys, or combinations thereof. The diffusion barrier layer may include Ta, TaN, Ti, TiN, CoW or a combination thereof.

In some embodiments, the interconnect die 120 may be a bridge, such as a silicon bridge, a local silicon interconnect (LSI), a silicon bus (Si-bus), or the like. The interconnect die 120 is able to provide a shorter electrical connection path between the overlying structure (e.g., a RDL structure 130 of FIG. 1G) subsequently formed on the back surface 120b of the interconnect die 120 and the underlying structure (e.g., a memory die 160 of FIG. 1G) subsequently formed on the front surface 120a of the interconnect die 120. In other words, in some embodiments in which the interconnect die 120 is the bridge, the interconnect die 120 includes interconnecting structure, and frees from active components (e.g., transistors or the like) and/or passive components (e.g., resistors, capacitors, inductors, or the like).

In some alternative embodiments, the interconnect die 120 may include an interconnect structure and active components (e.g., transistors or the like) and, optionally, passive components (e.g., resistors, capacitors, inductors, or the like). The interconnect die 120 and the device die 110 may be the same type of dies or the different types of dies. For example, the device die 110 is a system on chip (SoC) die, while the interconnect die 120 is a silicon bridge die with vertical conductive paths (e.g., TSV die). Alternatively, the device die 110 and the interconnect die 120 are both system on chip (SoC) dies.

Although only one device die 110 and one interconnect die 120 are shown in FIG. 1A, the disclosure is not limited. In other embodiments, the number of the device die 110 and the interconnect die 120 may be adjusted by the needs.

Figure 1B:
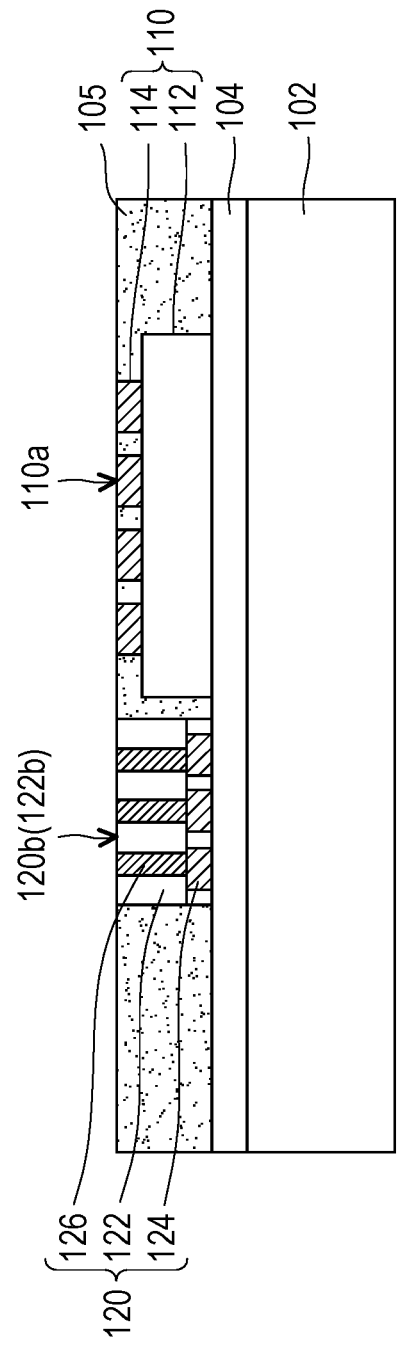

FIG. 1B illustrates laterally encapsulating the device die 110 and the interconnect die 120 by using a first encapsulant 105, in accordance with some embodiments. In some embodiments, the first encapsulant 105 may be formed by forming an encapsulation material to cover the device die 110 and the interconnect die 120, and then performing a planarization process to expose the active surface 110a of the device die 110 and the back surface 120b of the interconnect die 120. In such embodiment, the planarization process removes excess portions of the encapsulation material and exposes the pads 114 of the device die 110 and the TSVs 126 of the interconnect die 120. After the planarization process, the pads 114 and/or the TSVs 126 may have surfaces level with a surface of the first encapsulant 105. In some embodiments, the first encapsulant 105 may be, for example, a molding compound such as a resin, polyimide, PPS, PEEK, PES, epoxy molding compound (EMC), another material, the like, or a combination thereof. The planarization process may be performed, e.g., using a mechanical grinding process, a chemical mechanical polishing (CMP) process, or the like.

Figure 1C:
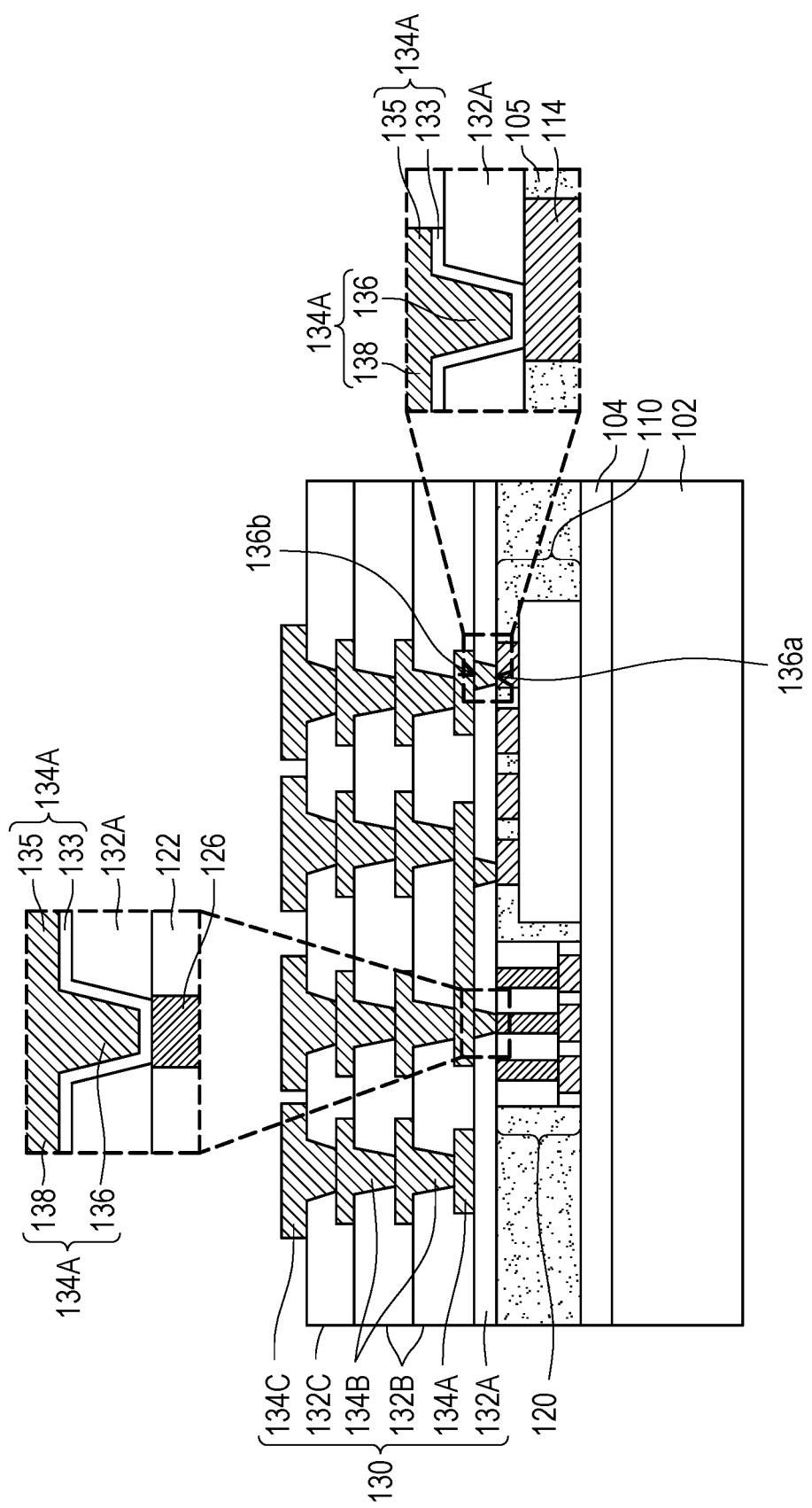

Referring to FIG. 1C, this figure illustrates the formation of a redistribution layer (RDL) structure 130 on the device die 110, the interconnect die 120, and the first encapsulant 105. In some embodiments, the RDL structure 130 includes a dielectric layer 132A, a metallization pattern 134A (sometimes referred to as redistribution layers or redistribution lines), one or more dielectric layers 132B, one or more metallization patterns 134B, one or more dielectric layers 132C, one or more metallization patterns 134C. More or fewer dielectric layers and metallization patterns, such as two to five dielectric layers and one to four metallization patterns, may be formed in the RDL structure 130. If fewer dielectric layers and metallization patterns are to be formed, steps and process discussed below may be omitted. If more dielectric layers and metallization patterns are to be formed, steps and processes discussed below may be repeated.

In some embodiments, the dielectric layer 132A is deposited on the device die 110, the interconnect die 120, and the first encapsulant 105. In some embodiments, the dielectric layer 132A is formed of a photo-sensitive material, such as polybenzoxazole (PBO), polyimide (PI), benzocyclobutene (BCB), or the like, or a combination thereof, which may be patterned using a lithography mask. The dielectric layer 132A may be formed by spin coating, lamination, CVD, the like, or a combination thereof. The dielectric layer 132A is then patterned. The patterning forms openings exposing the pads 114 of the device die 110 and the TSVs 126 of the interconnect die 120. The patterning may be by an acceptable process, such as by exposing and developing the dielectric layer 132A to light when the dielectric layer 132A is a photo-sensitive material or by etching using, for example, an anisotropic etch.

The metallization pattern 134A is then formed in the openings to connect the pads 114 of the device die 110 and the TSVs 126 of the interconnect die 120. The metallization pattern 134A includes conductive elements extending along the major surface of the dielectric layer 132A and extending through the dielectric layer 132A to contact the pads 114 of the device die 110 and the TSVs 126 of the interconnect die 120.

As shown in the enlarged view of FIG. 1C, the metallization pattern 134A may include a seed layer 133 and a conductive feature 135 on the seed layer 133. In some embodiments, as an example to form the metallization pattern 134A, a seed material is formed over the dielectric layer 132A and in the openings extending through the dielectric layer 132A. In some embodiments, the seed material is a metal layer, which may be a single layer or a composite layer comprising a plurality of sub-layers formed of different materials. In some embodiments, the seed material comprises a titanium layer and a copper layer over the titanium layer. The seed material may be formed using, for example, PVD or the like. A photoresist is then formed and patterned on the seed material. The photoresist may be formed by spin coating or the like and may be exposed to light for patterning. The pattern of the photoresist corresponds to the metallization pattern 134A. The patterning forms openings through the photoresist to expose the seed material. A conductive material is then formed in the openings of the photoresist and on the exposed portions of the seed material. The conductive material may be formed by plating, such as electroplating or electroless plating, or the like. The conductive material may comprise a metal, like copper, titanium, tungsten, aluminum, or the like. The photoresist and portions of the seed material on which the conductive material is not formed are removed. The remaining of the conductive material (also referred to as the conductive feature 135) and the underlying seed layer 133 form the metallization pattern 134A. In some embodiments, the seed layer 133 is in direct contact with the pads 114 of the device die 110 and the TSVs 126 of the interconnect die 120. The photoresist may be removed by an acceptable ashing or stripping process, such as using an oxygen plasma or the like. Once the photoresist is removed, exposed portions of the seed material are removed, such as by using an acceptable etching process, such as by wet or dry etching.

From another aspect, the metallization pattern 134A also includes a plurality of conductive vias 136 and a plurality of conductive lines 138. As shown in in the enlarged view of FIG. 1C, the conductive vias 136 are formed through the dielectric layer 132A to contact the pads 114 of the device die 110 and the TSVs 126 of the interconnect die 120, and the conductive lines 138 are formed on the conductive vias 136 and extending along the major surface of the dielectric layer 132A. In some embodiments, one of the conductive vias 136 has a first surface 136a and a second surface 136b opposite to each other. The first surface 136a has an area less than an area of the second surface 136b. Since the RDL structure 130 is formed after mounting the device die 110 and the interconnect die 120, the conductive vias 136 at a first tier (or the bottom tier) are in direct contact with the pads 114 of the device die 110 and the TSVs 126 of the interconnect die 120. That is, the first surface 136a of the conductive vias 136 may be in direct contact with the pads 114 of the device die 110 and the TSVs 126 of the interconnect die 120.

As shown in FIG. 1C, one or more dielectric layers 132B are deposited on the metallization pattern 134A and the dielectric layer 132A. The dielectric layers 132B may be formed in a manner similar to the dielectric layer 132A, and may be formed of a similar material as the dielectric layer 132A. One or more metallization patterns 134B are then formed. The metallization patterns 134B may include portions on and extending along the major surface of the dielectric layer 132B. The metallization patterns 134B further include portions extending through the dielectric layer 132B to physically and electrically couple the metallization pattern 134A. The metallization patterns 134B may be formed in a similar manner and of a similar material as the metallization pattern 134A. In some embodiments, the metallization patterns 134B have a different size than the metallization pattern 134A. For example, the conductive lines and/or vias of the overlying metallization patterns 134B may be wider or thicker than the conductive lines and/or vias of the underlying metallization pattern 134A. Further, the overlying metallization patterns 134B may be formed to a greater pitch than the underlying metallization pattern 134A.

As shown in FIG. 1C, one or more dielectric layers 132C are deposited on the metallization patterns 134B and the dielectric layers 132B. The dielectric layers 132C may be formed in a manner similar to the dielectric layers 132B, and may be formed of a similar material as the dielectric layers 132B. One or more metallization patterns 134C are then formed to accomplishing the RDL structure 130. The metallization patterns 134C may include portions on and extending along the major surface of the dielectric layers 132C. The metallization patterns 134C further include portions extending through the dielectric layers 132C to physically and electrically couple the metallization patterns 134B. The metallization patterns 134C may be formed in a similar manner and of a similar material as the metallization patterns 134B. In some embodiments, the metallization patterns 134C have a different size than the metallization patterns 134B. For example, the conductive lines and/or vias of the overlying metallization patterns 134C may be wider or thicker than the conductive lines and/or vias of the underlying metallization patterns 134B. Further, the overlying metallization patterns 134C may be formed to a greater pitch than the underlying metallization patterns 134B.

Figure 1D:
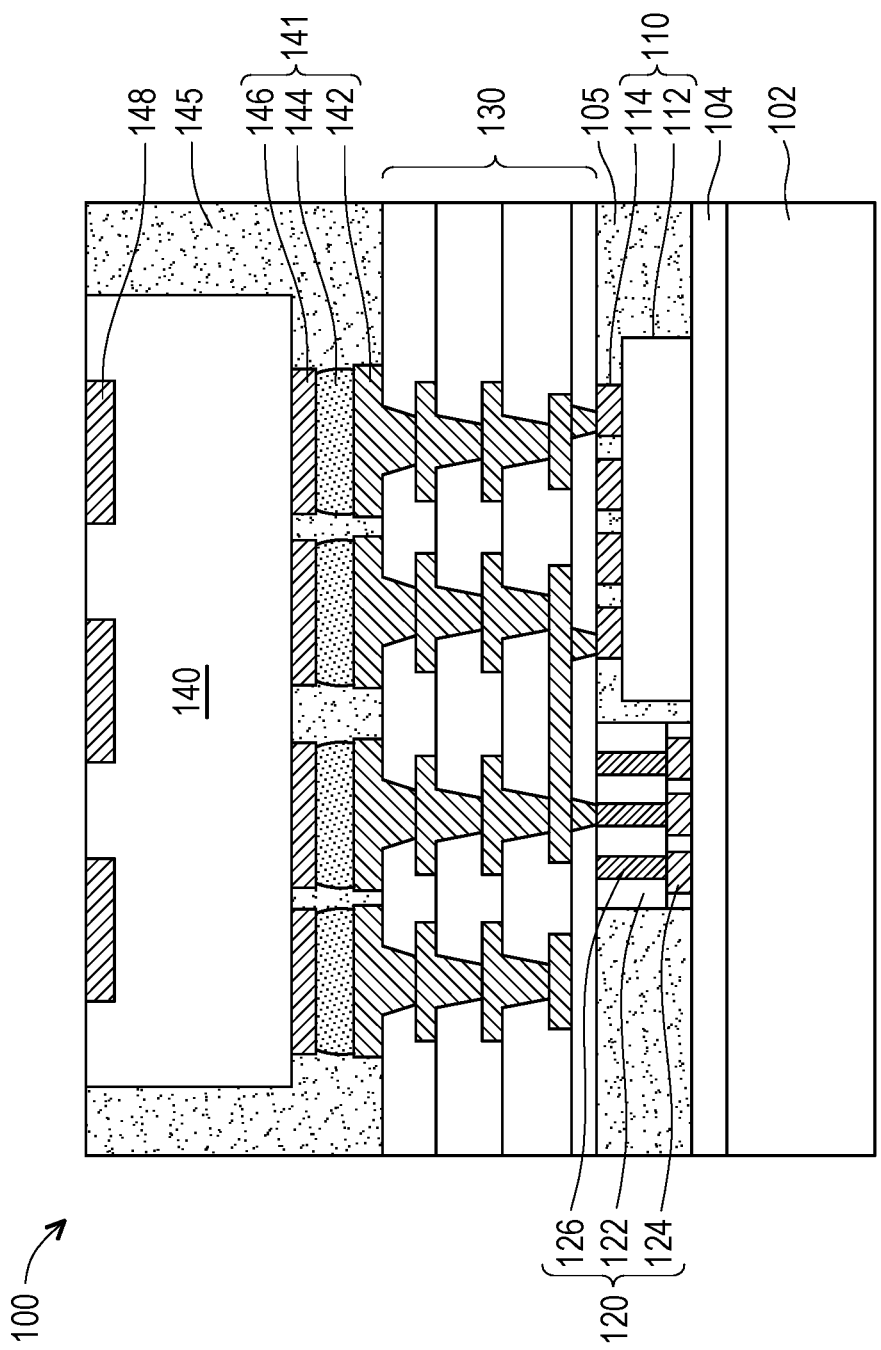

Referring to FIG. 1D, this figure illustrates bonding a package substrate 140 onto the RDL structure 130, so that the RDL structure 130 is sandwiched between the package substrate 140 and the device die 110, between the package substrate 140 and the interconnect die 120, and between the package substrate 140 and the first encapsulant 105. The package substrate 140 provides additional routing and stability to the RDL structure 130. For example, the package substrate 140 can reduce warping of the RDL structure 130. In some embodiments, the package substrate 140 has an area less than an area of the RDL structure 130, as shown in FIG. 1D. In some alternative embodiments, the package substrate 140 and the RDL structure 130 may have the same area.

In some embodiments, the package substrate 140 may be, for example, an interposer or a "semi-finished substrate," and may be free of active devices. In some embodiments, the package substrate 140 includes routing layers formed on a core substrate. The core substrate may include a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like.

The package substrate 140 may have one or more routing structures formed on each side of the core substrate and through vias extending through the core substrate. The routing structures and through vias provide additional electrical routing and interconnection. The routing structures may include one or more routing layers and one or more dielectric layers. In some embodiments, the routing layers and/or through vias may comprise one or more layers of copper, nickel, aluminum, other conductive materials, the like, or a combination thereof. In some embodiments, the dielectric layers may include materials such as a build-up material, ABF, a prepreg material, a laminate material, another material similar to those described above for the core substrate, the like, or combinations thereof.

In some embodiments, the package substrate 140 may include a passivation layer formed over one or more sides of the package substrate 140. The passivation layer may be a material such as a nitride, an oxide, a polyimide, a low-temp polyimide, a solder resist, combinations thereof, or the like. Once formed, the passivation layer may be patterned (e.g., using a suitable photolithographic and etching process) to expose portions of the routing layers of the routing structures.

FIG. 1D further illustrates bonding the package substrate 140 onto the RDL structure 130, in accordance with some embodiments. In an embodiment, the package substrate 140 is placed into physical contact with a plurality of solder regions 144 (e.g., reflowable bumps) that have been placed on the RDL structure 130, thereby forming a plurality of connectors 141. In some embodiments, one of the connectors 141 may be a micro-bump containing a solder region 144 between two copper posts 142 and 146, but the disclosure is not limited thereto, and other conductive structures such as solder bumps, gold bumps or metallic bumps may also be used as the connectors 141. The package substrate 140 may be placed using, e.g., a pick and place process. The package substrate 140 may be placed on the RDL structure 130. Once in physical contact, a reflow process may be utilized to bond the package substrate 140 onto the RDL structure 130 through the connectors 141. In some embodiments, the solder regions 144 are formed on the package substrate 140 instead of or in addition to the solder regions 144 being formed on the RDL structure 130. In some alternative embodiments, the solder regions 144 are not formed on the RDL structure 130, and the package substrate 140 is bonded to the RDL structure 130 by using a direct bonding technique such as a thermo-compression bonding technique. However, any suitable bonding technique may be used.

As shown in FIG. 1D, once the package substrate 140 has been attached, a second encapsulant 145 is formed to laterally encapsulate the package substrate 140 and the connectors 141. The second encapsulant 145 can protect the package substrate 140 and the connectors 141 from damage by the external environment, such as, oxygen or moisture. In some embodiments, the second encapsulant 145 may be formed by forming an encapsulation material to cover the package substrate 140 and the connectors 141, and then performing a planarization process to expose the top surface of the package substrate 140. In such embodiment, the planarization process removes excess portions of the encapsulation material and exposes the pads 148 of the package substrate 140. After the planarization process, the pads 148 may have surfaces level with a surface of the second encapsulant 145. In some embodiments, the second encapsulant 145 may be, for example, a molding compound such as a resin, polyimide, PPS, PEEK, PES, epoxy molding compound (EMC), another material, the like, or a combination thereof. The planarization process may be performed, e.g., using a mechanical grinding process, a CMP process, or the like.

Figure 1E:
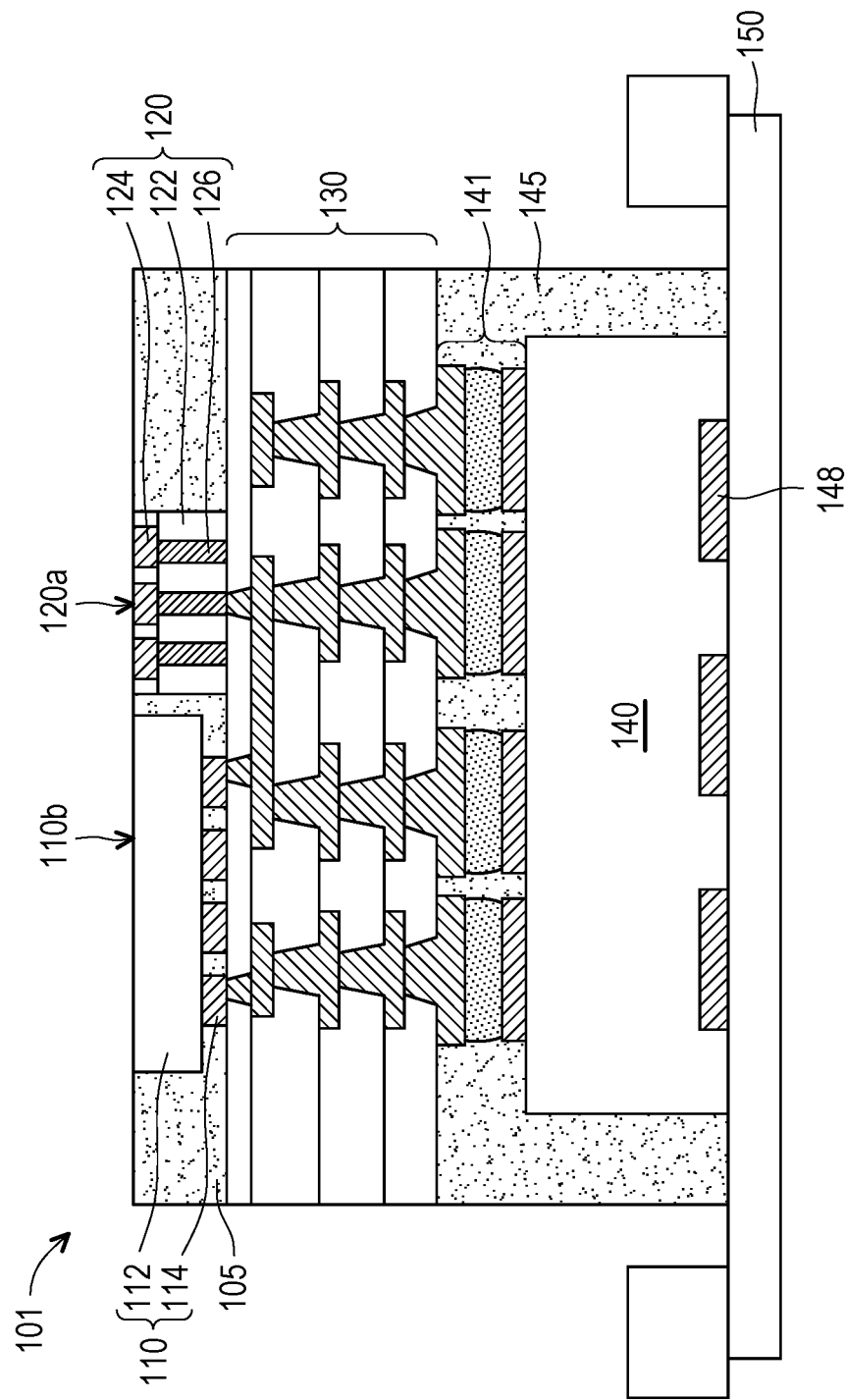

FIG. 1E illustrates de-bonding the carrier 102 and attaching an overlying structure 100 of FIG. 1D to a carrier tape 150 (e.g., a blue tape, UV film, or the like). In some embodiments, once de-bonded from the carrier 102, the overlying structure 100 is then flipped over the carrier tape 150, so that the pads 148 of the package substrate 140 face toward the carrier tape 150 while the backside 110b of the device die 100 and the front surface 120a of the interconnect die 120 faces upward. Afterwards, the overlying structure 100 is bonded to the carrier tape 150 for further processing. The carrier 102 may be de-bonded similar to the processes used to remove the carrier 102. For example, the carrier 102 may be de-bonded by projecting a light on the release film 104, so that the release film 104 decomposes under the heat of the light and the carrier 102 can be removed. Once de-bonded, the overlying structure 100 may be flipped over and attached to the carrier tape 150. The carrier tape 150 provides both adhesion and protection for the attached surfaces of the package substrate 140 and allows for further processing at the upper side of the overlying structure 100.

After bonding the overlying structure 100 onto the carrier tape 150, the overlying structure 100 may be singulated (e.g., via sawing, laser drilling, etching, combinations, or the like) into a plurality of packages 101. FIG. 1E illustrates a single package 101 for clarity and example.

Figure 1F:
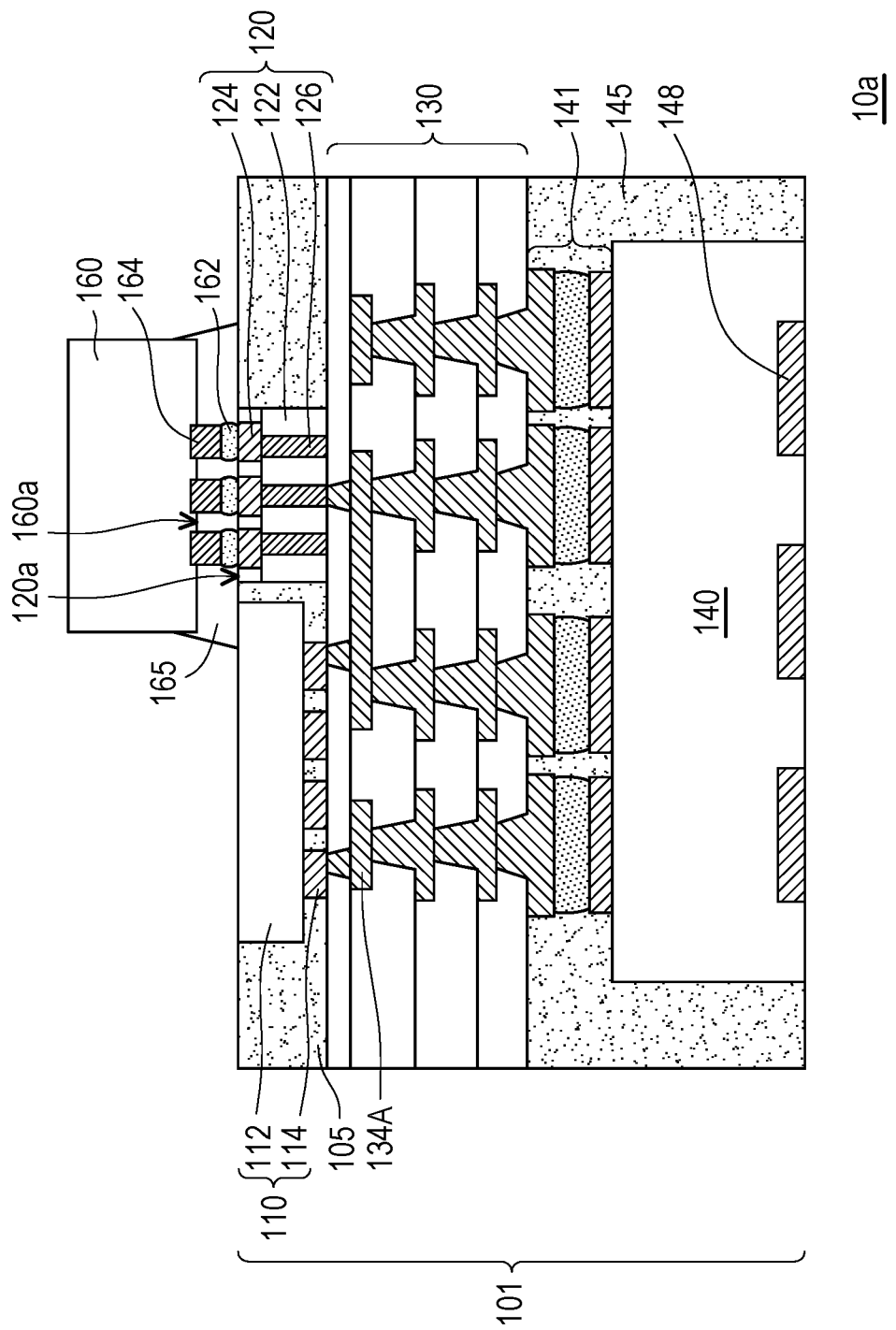

FIG. 1F illustrates the formation of a packaged structure 10a, in accordance with some embodiments. The packaged structure 10a may be formed by bonding a memory device 160 onto the interconnect die 120 through a plurality of external connectors 162. In some embodiments, the memory device 160 (also referred to as a second die) is bonded onto the interconnect die 120 by a flip-chip manner. That is, the memory device 160 has an active surface 160a facing toward the front surface 120a of the interconnect die 120, and a plurality of contacts 164 distributed on the active surface 160a of the memory die 160 are in physical contact with the external connectors 162. The memory device 160 may be placed such that the contacts 164 of the memory device 160 (e.g., contact pads, conductive connectors, solder bumps, or the like) are aligned with corresponding ones of the external connectors 162. According to some embodiments, the memory device 160 may be placed using a suitable process such as a pick-and-place process. However, any suitable process may be used. In this case, the contacts 164 may be electrically connected to the contacts 124 of the interconnect die 120 through the external connectors 162. In some embodiments, the memory die 160 may include dynamic random access memory (DRAM) die, a stacked memory die, a high-bandwidth memory (HBM) die, or the like. Although only one memory die 160 is shown in FIG. 1F, the disclosure is not limited. In other embodiments, the number of the memory die 160 may be adjusted by the needs.

Additionally, once the memory die 160 is in physical contact with the external connectors 162 described above with respect to FIG. 1F, a reflow process may be utilized to bond the external connectors 162 to the memory die 160. Once bonded, an underfill 165 may be formed to between the memory die 160 and interconnect die 120, and the external connectors 162 and the contacts 164 may be laterally encapsulated by the underfill 165 according to some embodiments. In some embodiments, the underfill 165 may be a material such as a molding compound, an epoxy, an underfill, a molding underfill (MUF), a resin, or the like.

It should be noted that the memory die 160 is jointed on the interconnect die 120 after performing the electrical test of the package 101. That is, the electrical test may be conducted to the pads 148 of the package substrate 140 to ensure electrical conduction between the device die 110 and package substrate 140, and between the interconnect die 120 and the package substrate 140. In such embodiment, the package 101 is referred to as a known good package. The memory last process may decrease the risk of the electrical failure after jointing the memory die 160, thereby enhancing the reliability and yield of the package structure 10a.

In the present embodiment, the memory die 160 may be electrically connected to the device die 110 through the interconnect die 120 and the RDL structure 130. The electrical routing of the interconnect die 120 may include fine-pitch interconnect structure having a pitch less than about 90 μm. The fine-pitch interconnect structure including the TSVs 126 in the interconnect die 120 may be formed, for example, using single damascene and/or dual damascene processes in the front-end-of-line (FEOL) process. By forming the electrical routing having a fine pitch, the density of the electrical routing in the interconnect die 120 may be increased, thus improving the routing ability of the interconnect die 120. In some cases, a higher density of electrical routing in the interconnect die 120 may allow a smaller amount of routing to be formed elsewhere in a package structure. This can decrease the size of a package structure, reduce the processing cost of a package, or improve performance by reducing the routing distances within a package. In some cases, the use of a fine-pitch formation process (e.g., a damascene or dual damascene process) may allow for improved conduction and connection reliability within the interconnect die 120. In some cases, during high-speed operation (e.g., greater than about 2 Gbit/sec), electrical signals may be conducted near the surfaces of conductive components (e.g., the metallization pattern 134A at the first tier). For example, the interconnect die 120 with the fine-pitch interconnect structure may decrease the routing distance between the memory die 160 and the device die 110 to increase the electrical signal transmission speed, thereby improving the performance of the high speed operation circuits. In some alternative embodiments, the fine-pitch routing may have less surface roughness than other types of routing, and thus can reduce resistance experienced by higher-speed signals and also reduce signal loss (e.g., insertion loss) during high-speed operation. This can improve the performance of high-speed operation, for example, of Serializer/Deserializer ("SerDes") circuits or other circuits that may be operated at higher speeds.

Figure 1G:
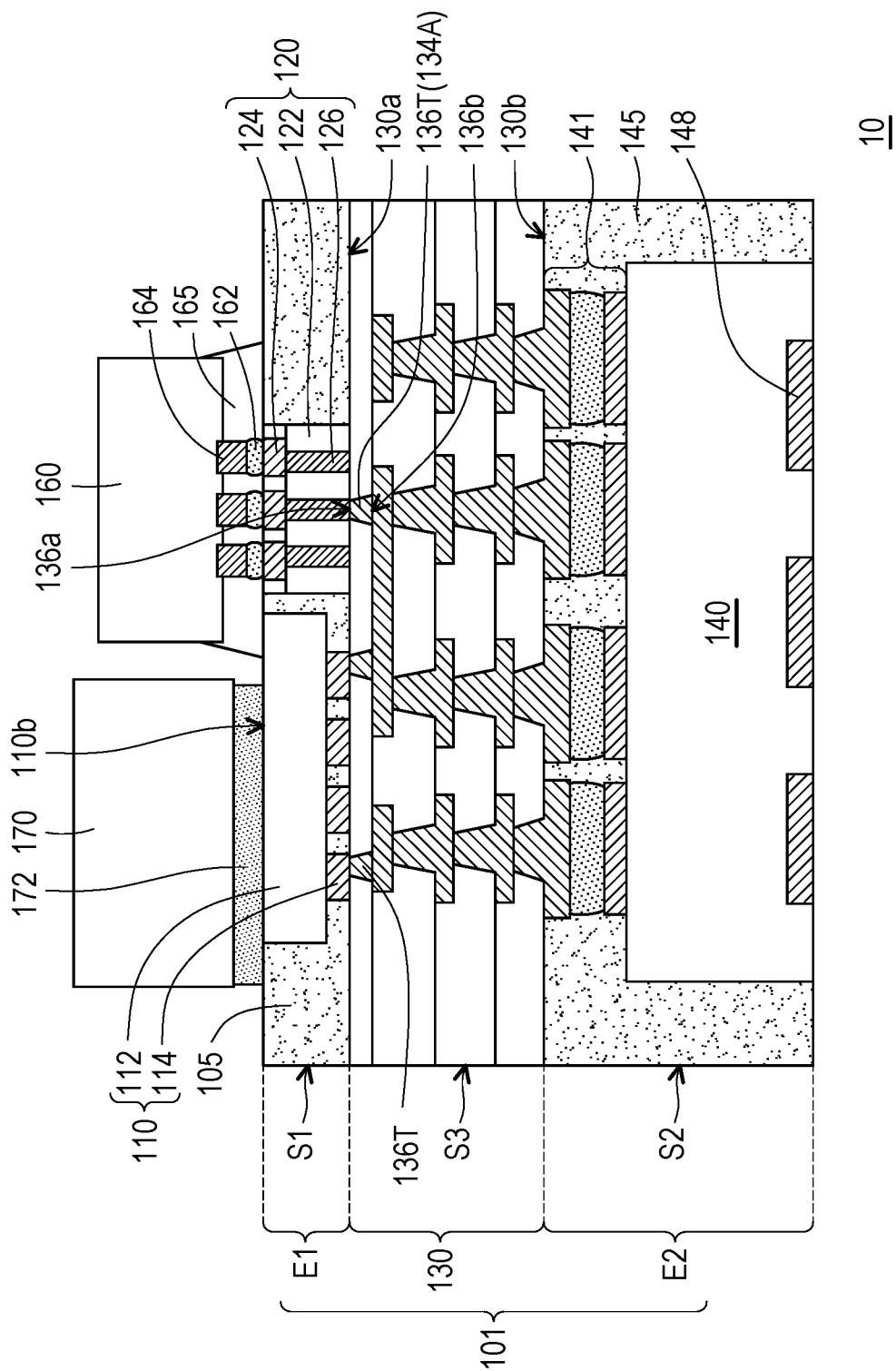

FIG. 1G illustrates the formation of a packaged structure 10, in accordance with some embodiments. The packaged structure 10 may be formed by forming a heat sink (or heat spreader) 170 on the backside 110b of the device die 110 through a thermal interface material (TIM) 172. In some embodiments, the device die 110 may trap heat to become hot spots in the package structure 10. Therefore, the heat sink 170 may thermally couple the device die 110 to dissipate the heat from the device die 110 to the heat sink 170. Specifically, the TIM 172 is formed on the backside 110b of the device die 110, and the heat sink 170 is then attached onto the TIM 172. In some embodiments, the heat sink 170 has a high thermal conductivity (e.g., larger than 100 Wm$^{-1}$K$^{-1}$) and may include a metal, a metal alloy, or the like. For example, the heat sink 170 may include Al, Cu, Ni, Co, combinations of the foregoing materials, and the like. In addition, the TIM 172 may be formed from a material with higher thermal conductivity (k), such as Ag, Cu, Sn, In, carbon nanotube (CNT), graphite, or the like. In some alternative embodiments, the TIM 172 is formed from another material, such as a polymer material, solder paste, indium solder paste, or the like. In some embodiments, the heat sink 170 and the TIM 172 may overlay the backside 110b of the device die 110 and further extend to cover a portion of the top surface of the first encapsulant 105, as shown in FIG. 1G. In some alternative embodiments, the heat sink 170 and the TIM 172 may only overlay the backside 110b of the device die 110 and not extend on the top surface of the first encapsulant 105.

In the present embodiments, the package structure 10 includes the package 101, the memory die 160, and the heat sink 170. In some embodiments, the package 101 is referred to as a system on integrated substrate (SoIS) package which include the RDL structure 130, a first encapsulation structure E1, and a second encapsulation structure E2. In detail, the RDL structure 130 may have a first surface 130a and a second surface 130b opposite to each other. The first encapsulation structure E1 may be disposed on the first surface 130a of the RDL structure 130. In some embodiments, the first encapsulation structure E1 includes the device die 110, the interconnect die 120, and the first encapsulant 105. The device die 110 and the interconnect die 120 are disposed on the first surface 130a of the RDL structure 130 side by side, and laterally encapsulated by the first encapsulant 105. In some embodiments, the device die 110 is bonded onto the first surface 130a of the RDL structure 130 by a flip-chip manner. That is, the pads 114 distributed on the active surface 110a of the device die 110 face toward the first surface 130a of the RDL structure 130, and the pads 114 of the device die 110 is in (physical and/or direct) contact with a portion of the topmost conductive vias 136T of the RDL structure 130. In some embodiments, the topmost conductive via 136T has an upper surface 136a and a lower surface 136b greater than the upper surface 136a, and the upper surface 136a is in direct contact with a corresponding pad 114. Similarly, another portion of the topmost conductive vias 136T of the RDL structure 130 may be in direct contact with the TSVs 126 of the interconnect die 120.

In addition, the second encapsulation structure E2 is disposed on the second surface 130b of the RDL structure 130, so that the RDL structure 130 is sandwiched between the first encapsulation structure E1 and the second encapsulation structure E2. In some embodiments, the second encapsulation structure E2 includes the package substrate 140 laterally encapsulated by the second encapsulant 145, and the package substrate 140 is bonded onto the second surface 130b of the RDL structure 130 through the connectors 141. In the present embodiment, since the package structure 10 is obtained from the singulated package 101 (FIG. 1E), the RDL structure 130, the first encapsulation structure E1, and the second encapsulation structure E2 may have sidewalls aligned to each other. That is, the sidewall S1 of the first encapsulation structure E1, the sidewall S2 of the second encapsulation structure E2, and the sidewall S3 of the RDL structure 130 may be vertically coincident, i.e., may be located within a vertical plane including the sidewalls S1, S2, and S3.

Further, the memory die 160 may be bonded onto the interconnect die 120, so that the memory die 160 is electrically connected to the device die 110 through the interconnect die 120 and the RDL structure 130. Moreover, the heat sink 170 may be optionally attached on the backside 110b of the device die 110 through the TIM 172 for the heat dissipation.

In an embodiment, the conventional device die is bonded on the RDL structure by the flip-chip bonding (FCB) or the thermal-compression bonding (TCB). In this case, the conventional package structure may face the joint yield problem due to the warpage issue, the bump coplanarity issue, or the like, after the reflow process in the FCB or TCB. In the present embodiment, the RDL structure 130 is formed on the device die 110 and the interconnect die 120 after forming the first encapsulation structure E1. In this case, the solder is free of between the metallization pattern 134A and the pads 114 of the device die 110, and between the metallization pattern 134A and the TSVs 126 of the interconnect die 120, which resolve the warpage issue and/or the bump coplanarity issue after the reflow process in the FCB or TCB, thereby improving the joint yield between the device die 110 and the RDL structure 130. Further, the metallization pattern 134A of the RDL structure 130 may be formed to be aligned/connected with the pads 114 and the TSVs 126 by using the lithography method. In such embodiment, the joint yield between the RDL structure 130 and the device die 110 and/or the interconnect die 120 may be increased compared with the conventional FCB or TCB.

Figure 2:
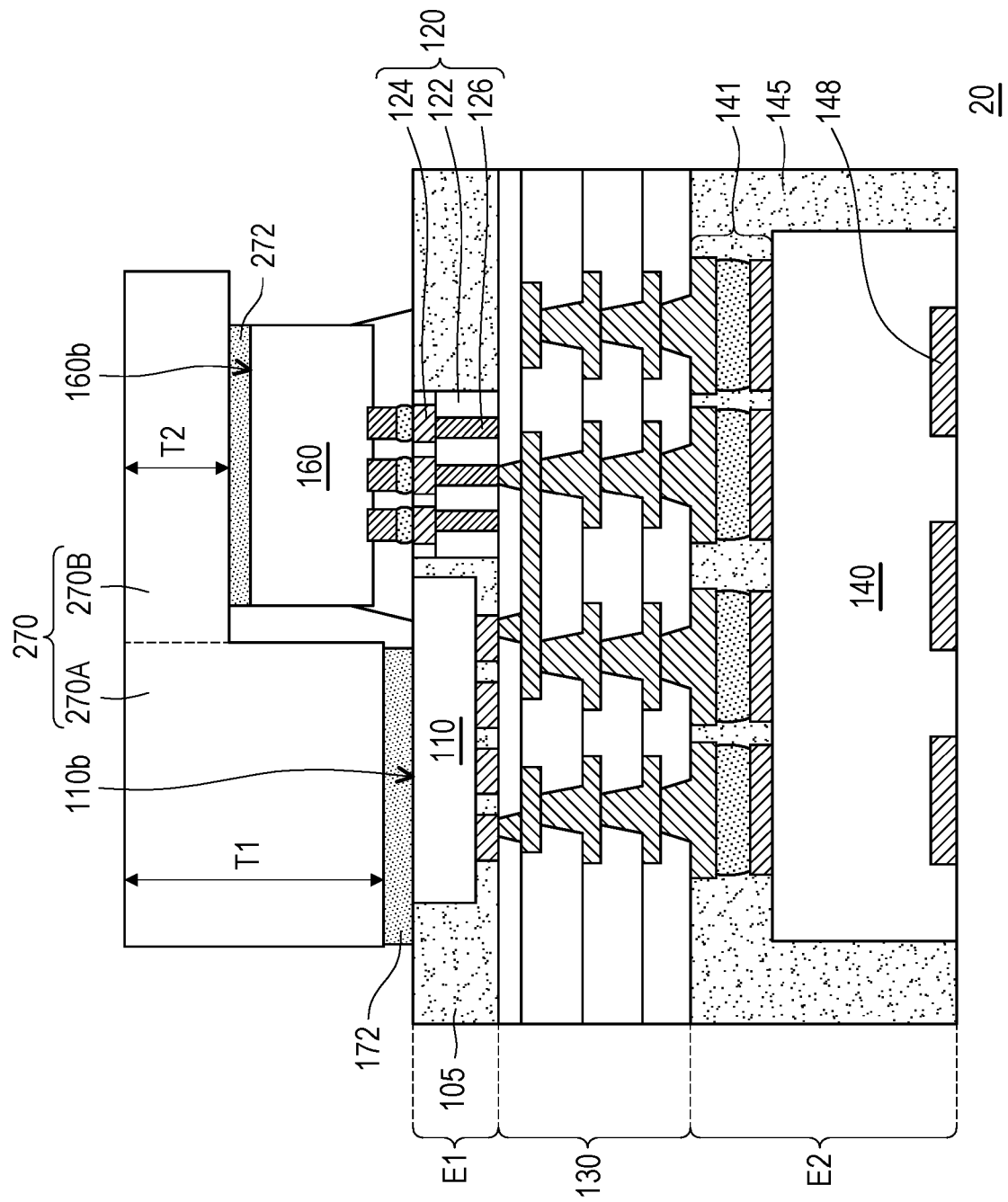
FIG. 2 is a cross-sectional view of a package structure in accordance with a second embodiment.

FIG. 2 is a cross-sectional view of a package structure in accordance with a second embodiment.

Referring to FIG. 2, a package structure 20 of the second embodiment is similar to the package structure 10 of the first embodiment. That is, the structures, materials, and functions of the package structure 20 are similar to those of the package structure 10, and thus the details are omitted herein. The main difference between the package structure 20 and the package structure 10 lies in that the package structure 20 includes a heat sink 270 extending to cover a backside 160b of the memory die 160. In detail, the heat sink 270 may include a first portion 270A and a second portion 270B. The first portion 270A may overlay the backside 110b of the device die 110 through the TIM 172. The second portion 270B may overlay the backside 160b of the memory die 160 through the TIM 272. In addition, since the memory die 160 is higher than the device die 110, the first portion 270A has a first thickness T1, and the second portion 270B has a second thickness T2 less than the first thickness T1. The materials, forming methods, and functions of the heat sink 270 and the TIM 272 are similar to those of the heat sink 170 and the TIM 172, and thus the details are omitted herein.

Figure 3:
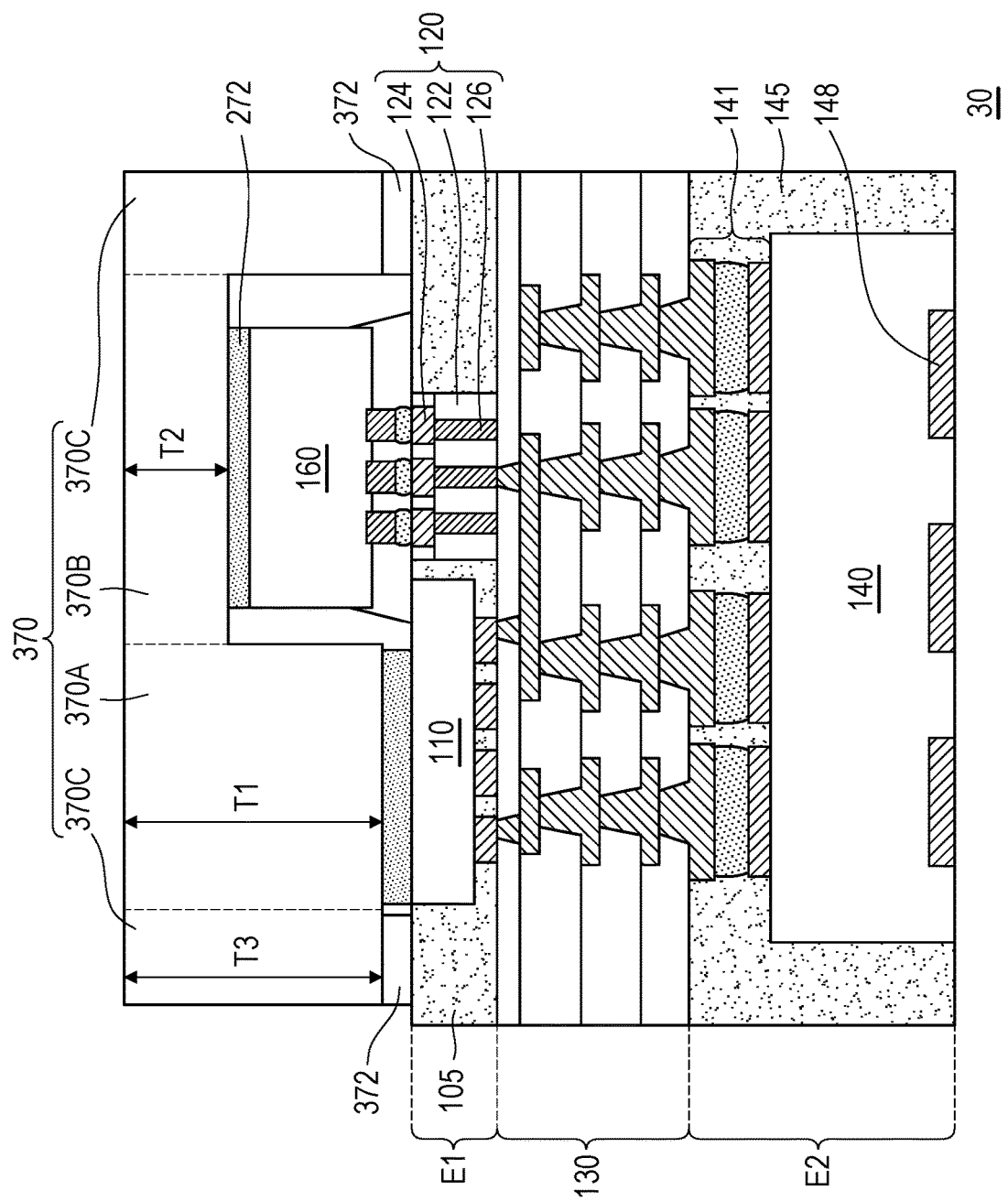
FIG. 3 is a cross-sectional view of a package structure in accordance with a third embodiment.

FIG. 3 is a cross-sectional view of a package structure in accordance with a third embodiment.

Referring to FIG. 3, a package structure 30 of the third embodiment is similar to the package structure 20 of the second embodiment. That is, the structures, materials, and functions of the package structure 30 are similar to those of the package structure 20, and thus the details are omitted herein. The main difference between the package structure 30 and the package structure 20 lies in that the package structure 30 includes a heat sink 370 adhered onto the first encapsulant 105 through an adhesive layer 372. In detail, the heat sink 370 may include a first portion 370A, a second portion 370B, and a third portion 370C. The first portion 370A may be attached onto the backside 110b of the device die 110 through the TIM 172. The second portion 370B may be attached onto the backside 160b of the memory die 160 through the TIM 272. The third portion 370C may laterally surround the first portion 370A and the second portion 370B. In some embodiment, the third portion 370C may be referred to as a stiffener ring which is adhered onto the first encapsulant 105 through the adhesive layer 372 to increase the rigid of the heat sink 370, thereby reducing the warpage of the package structure 30. From another aspect, the heat sink 370 may include a cavity to accommodate the memory die 160. In this case, the heat sink 370 may overlay the memory die 160 to prevent the electromagnetic interference (EMI). In such embodiment, the first portion 370A has a first thickness T1, the second portion 370B has a second thickness T2, and the third portion 370C has a third thickness T3. The second thickness T2 may be less than the first thickness T1 and/or the third thickness T3, and the first thickness T1 may be substantially equal to the third thickness T3. The material, forming method, and function of the heat sink 370 are similar to those of the heat sink 170, and thus the details are omitted herein.

Figure 4:
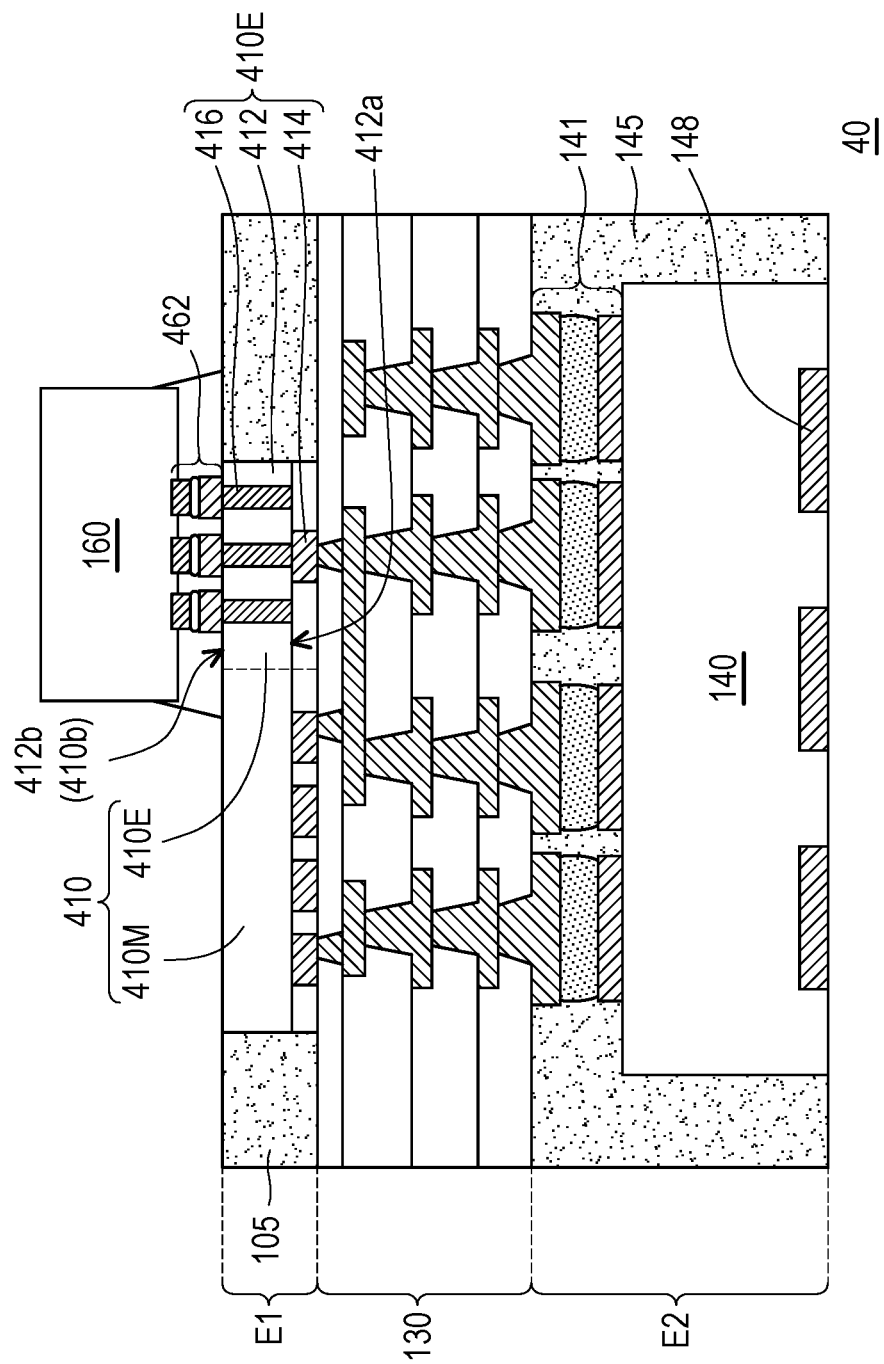
FIG. 4 is a cross-sectional view of a package structure in accordance with a fourth embodiment.

FIG. 4 is a cross-sectional view of a package structure in accordance with a fourth embodiment.

Referring to FIG. 4, a package structure 40 of the fourth embodiment is similar to the package structure 10a of the first embodiment, but the package structure 40 includes a device die 410 of merging the device die 110 and the interconnect die 120. In detail, the device die 410 may include a main body portion 410M and an extension portion 410E. The configuration, material, and function of the main body portion 410M are similar to those of the device die 110, and thus the details are omitted herein. The extension portion 410E is used to replace the interconnect die 120 of the package structure 10a. In such embodiment, the extension portion 410E includes a substrate 412, a plurality of pads 414, and a plurality of TSVs 416. The substrate 412 has a front surface 412a and a back surface 412b opposite to each other. The pads 414 may be distributed on the front surface 412a of the substrate 412. The TSVs 416 may extend from the front surface (i.e., a bottom surface) 412a of the substrate 412 to a back surface (i.e., a top surface) 412b of the substrate 412, so as to electrically connect the RDL structure 130 and the memory die 160. In addition, the memory die 160 is bonded onto the backside 410b of the extension portion 410E through a plurality of external connectors 462, wherein the external connectors 462 are in direct contact with the TSVs 416. In some embodiments, the external connectors 462 may be solder balls, metal pillars, controlled collapse chip connection (C4) bumps, micro bumps, electroless nickel-electroless palladium-immersion gold technique (ENEPIG) formed bumps, or the like. The external connectors 462 may include a conductive material such as solder, copper, aluminum, gold, nickel, silver, palladium, tin, the like, or a combination thereof. In some embodiments, the s external connectors 462 are formed by initially forming a layer of solder through evaporation, electroplating, printing, solder transfer, ball placement, or the like.

Figure 5:
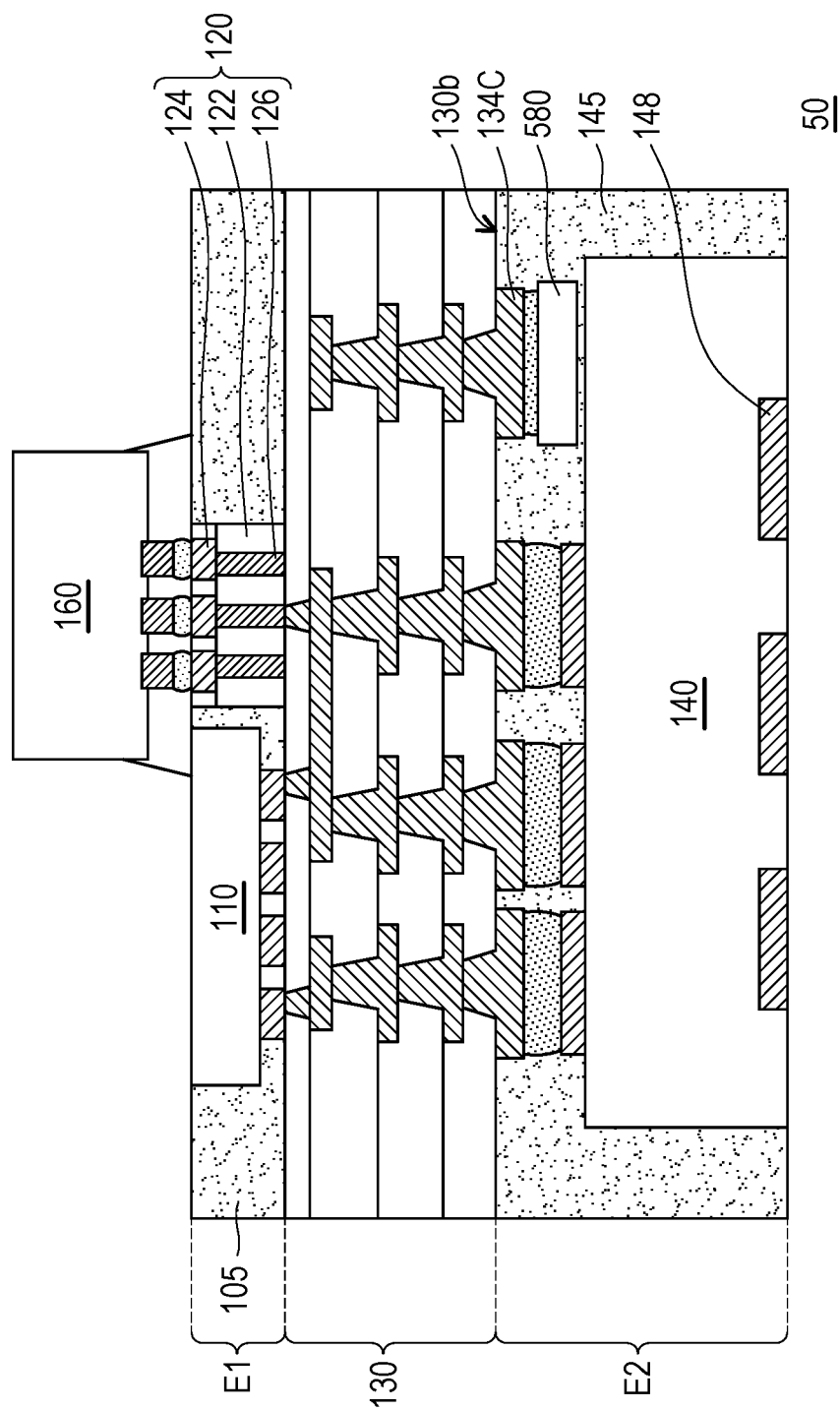
FIG. 5 is a cross-sectional view of a package structure in accordance with a fifth embodiment.

FIG. 5 is a cross-sectional view of a package structure in accordance with a fifth embodiment.

Referring to FIG. 5, a package structure 50 of the fifth embodiment is similar to the package structure 10a of the first embodiment. That is, the structures, materials, and functions of the package structure 50 are similar to those of the package structure 10a, and thus the details are omitted herein. The main difference between the package structure 50 and the package structure 10a lies in that the package structure 50 further includes an embedded component 580 disposed in the second encapsulation structure E2. In detail, as shown in FIG. 5, the embedded component 580 is disposed between the package substrate 140 and the RDL structure 130, and is bonded onto the RDL structure 130 and spaced from the package substrate 140 by a non-zero distance. That is, the second encapsulant 145 may be formed between the bottom surface of the embedded component 580 and the top surface of the package substrate 140. In some embodiments, the embedded component 580 includes but are not limited to a component, such as integrated passive devices (IPDs) (e.g., multi-layer ceramic capacitors (MLCCs), coil inductors, film resistors, or the like). The embedded component 580 may comprise one or more passive components formed within a die substrate such as, a bulk silicon, doped or undoped, or an active layer of a silicon-on-insulator (SOI) substrate. The one or more passive components may be connected by a plurality of die metallization routing layers formed on the die substrate and are designed to connect the various devices, formed within or on the die substrate, to one another in order to form functional circuitry. The embedded component 580 comprise die contact pads formed in electrical contact with the die metallization routing layers for external connection to the embedded component 580. In some embodiments, the embedded component 580 may be placed in contact with the metallization patterns 134C of the RDL structure 130 at the second surface 130b by using a pick-and-place process. Once in physical contact with the metallization patterns 134C of the RDL structure 130, a reflow process may be performed to bond the solder material to the RDL structure 130 and thus attach the embedded component 580 to the package structure 50. Although only one embedded component 580 is illustrated in FIG. 5, the disclosure is not limited. In other embodiments, the number of the embedded component 580 may be adjusted by the needs.

Figure 6:
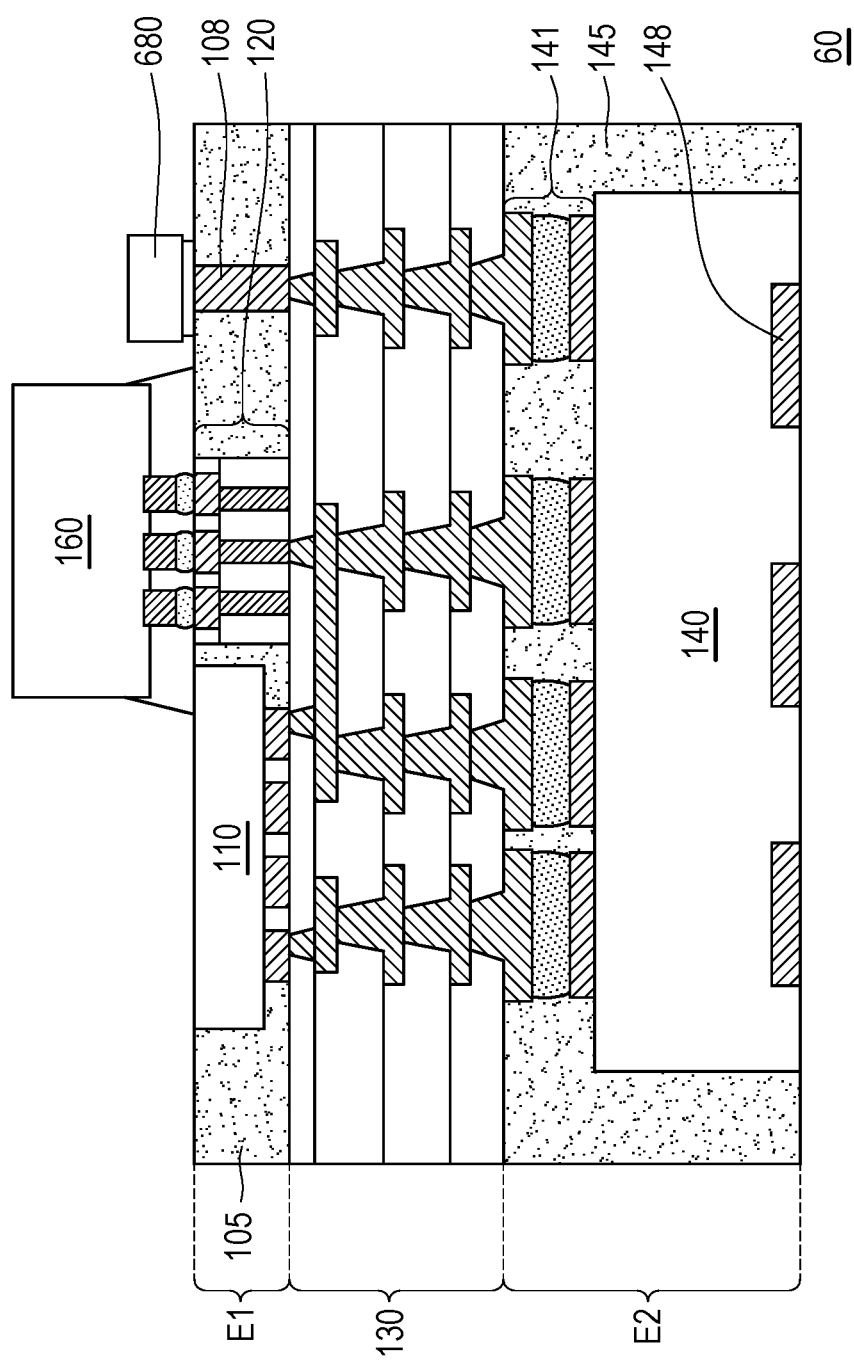
FIG. 6 is a cross-sectional view of a package structure in accordance with a sixth embodiment.

FIG. 6 is a cross-sectional view of a package structure in accordance with a sixth embodiment.

Referring to FIG. 6, a package structure 60 of the sixth embodiment is similar to the package structure 10a of the first embodiment. That is, the structures, materials, and functions of the package structure 60 are similar to those of the package structure 10a, and thus the details are omitted herein. The main difference between the package structure 60 and the package structure 10a lies in that the package structure 60 further includes a passive component 680 aside the memory die 160 and on the first encapsulant 105. In some embodiments, as shown in FIG. 6, the passive component 680 is electrically connected to the RDL structure 130 through a through-molding via (TMV) 108 in the first encapsulant 105. The TMV 108 may include a conductive material, such as copper, titanium, tungsten, aluminum, another metal, the like, or a combination thereof, and may be formed by a deposition process, such as electroplating, electroless plating, or the like. However, while the material and methods discussed are suitable to form the conductive material, these are merely examples. Any other suitable materials or any other suitable processes of formation, such as CVD or PVD, may also be used to form the TMV 108. In some embodiments, the passive component 680 may include an integrated passive device (IPD), a surface mount device (SMD), or the like, or a combination thereof. In some embodiments, the passive component 680 may be placed in contact with the TMV 108 by using a pick-and-place process. Once in physical contact with the TMV 108, a reflow process may be performed to bond the solder material to the TMV 108 and thus attach the passive component 680 to the package structure 60. Although only one passive component 680 and the TMV 108 are illustrated in FIG. 6, the disclosure is not limited. In other embodiments, the number of the passive component 680 and the TMV 108 may be adjusted by the needs.

In addition, although there is no heat sink disposed on the backside of the device dies 110 and 410 in the package structures 40, 50, and 60 shown in FIGS. 4-6, the embodiments of the present invention are not limited thereto. In some alternative embodiments, the heat sink may be formed on the backside of the device dies 110 and 410 in the package structures 40, 50, and 60 shown in FIGS. 4-6 for further heat dissipation.

Figure 7:
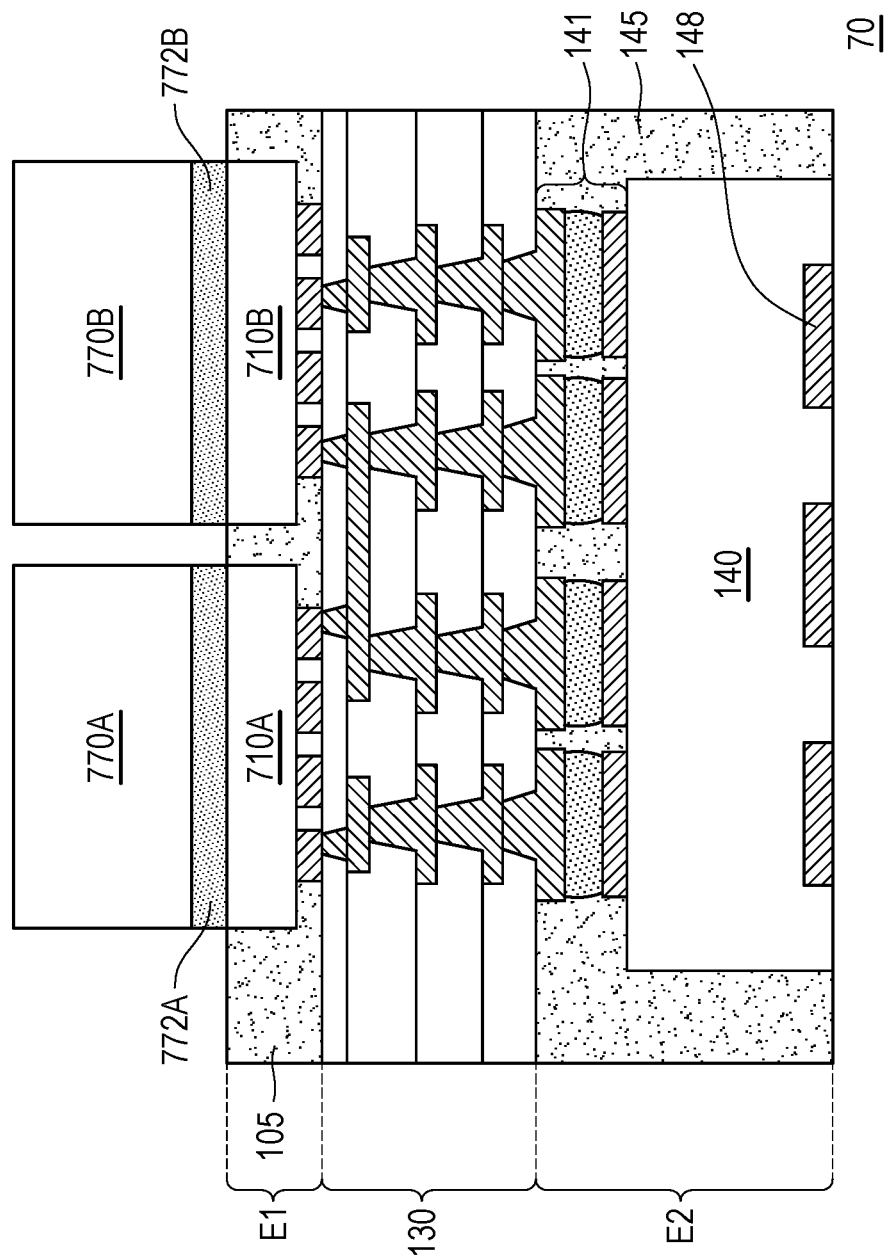
FIG. 7 is a cross-sectional view of a package structure in accordance with a seventh embodiment.

FIG. 7 is a cross-sectional view of a package structure in accordance with a seventh embodiment.

Referring to FIG. 7, a package structure 70 of the seventh embodiment is similar to the package structure 10 of the first embodiment, but the first encapsulation structure E1 of the package structure 70 only includes a plurality of device dies 710A and 710B disposed on the RDL structure 130 side by side. In detail, as shown in FIG. 7, the device dies 710A and 710B are bonded on the first surface 130a of the RDL structure 130 in the flip-chip manner. The device dies 710A and 710B are laterally encapsulated by the first encapsulant 105 to form the first encapsulation structure E1. After forming the first encapsulation structure E1, a heat sink 770A is disposed on the backside of the device die 710A through the TIM 772A, and a heat sink 770B is disposed on the backside of the device die 710B through the TIM 772B. In some embodiments, the heat sink 770A and/or the TIM 772A are spaced from the heat sink 770B and/or the TIM 772B, as shown in FIG. 7. However, the disclosure is not limited thereto, in other embodiments, the heat sink 770A may be connected to the heat sink 770B to form a continuous heat sink structure, and the TIM 772A may be connected to the TIM 772B to form a continuous TIM structure.

In accordance with an embodiment, a method of forming a package structure, comprising: laterally encapsulating a device die and an interconnect die by a first encapsulant; forming a redistribution layer (RDL) structure on the device die, the interconnect die, and the first encapsulant; bonding a package substrate onto the RDL structure, so that the RDL structure is sandwiched between the package substrate and the device die, the interconnect die, and the first encapsulant; laterally encapsulating the package substrate by a second encapsulant; and bonding a memory die onto the interconnect die, wherein the memory die is electrically connected to the device die through the interconnect die and the RDL structure. In some embodiments, the laterally encapsulating the device die and the interconnect die by the first encapsulant comprises: mounting the device die and the interconnect die on a carrier, wherein the device die has a backside toward the carrier; forming an encapsulation material to cover the device die and the interconnect die; and performing a planarization process to expose an active surface of the device die and a back surface of the interconnect die. In some embodiments, the RDL structure comprises a redistribution layer having a plurality of conductive lines and a plurality of conductive vias, wherein the conductive vias at a first tier are in contact with a plurality of pads on the active surface of the device die, one of the conductive vias at the first tier has an upper surface and a lower surface greater than the upper surface, and the upper surface is in direct contact with a corresponding pad. In some embodiments, the RDL structure comprises a redistribution layer having a plurality of conductive lines and a plurality of conductive vias, the conductive vias at a first tier are in contact with a plurality of pads on the active surface of the device die, wherein one of the conductive vias at the first tier comprises a seed layer and a conductive feature on the seed layer, and the seed layer is in direct contact with a corresponding pad. In some embodiments, further comprising: forming a heat sink on a backside of the device die. In some embodiments, the heat sink further extends to cover a backside of the memory die. In some embodiments, the heat sink is adhered onto the first encapsulant through an adhesive layer. In some embodiments, further comprising: forming an embedded component between the package substrate and the RDL structure, wherein the embedded component is bonded onto the RDL structure and spaced from the package substrate by a non-zero distance. In some embodiments, further comprising: forming a passive component aside the memory die and on the first encapsulant, wherein the passive component is electrically connected to the RDL structure through a through-molding via (TMV) in the first encapsulant.

In accordance with an embodiment, a method of forming a package structure, comprising: laterally encapsulating at least one first die by a first encapsulant; after laterally encapsulating the at least one first die by the first encapsulant, forming a redistribution layer (RDL) structure on the at least one first die and the first encapsulant, wherein the RDL structure at least comprises: a plurality of conductive vias contacting a plurality of pad distributed on an active surface of the at least one first die, one of the plurality of conductive vias has a first surface and a second surface greater than the first surface, and the first surface is in direct contact with a corresponding pad; bonding a package substrate onto the RDL structure, so that the RDL structure is sandwiched between the package substrate and the at least one first die, and the first encapsulant; and laterally encapsulating the package substrate by a second encapsulant. In some embodiments, the at least one first die comprises a plurality of device dies, and the plurality of device dies are disposed side by side and laterally encapsulated by the first encapsulant. In some embodiments, further comprising: forming a heat sink on a backside of the plurality of device dies. In some embodiments, the at least one first die comprises an extension portion, the extension portion has a plurality of substrate-through vias (TSVs) extending from a top surface of a substrate of the at least one first die to a bottom surface of the substrate of the at least one first die. In some embodiments, further comprising: bonding a second die onto the extension portion, wherein the second die is electrically connected to the package substrate through the TSVs in the extension portion and the RDL structure. In some embodiments, the second die is different from the at least one first die, and the second die comprises a memory die.

In accordance with an embodiment, a package structure, comprising: a redistribution layer (RDL) structure, having a first surface and a second surface opposite to each other; a first encapsulation structure, disposed on the first surface of the RDL structure, wherein the first encapsulation structure comprises: a device die, having a plurality of pads distributed on an active surface of the device die, wherein the RDL structure at least comprises a plurality of conductive vias, a topmost conductive via has an upper surface and a lower surface greater than the upper surface, and the upper surface is in direct contact with a corresponding pad; an interconnect die, comprising a plurality of through-substrate vias (TSVs) extending from a top surface of a substrate of the interconnect die to a bottom surface of the substrate of the interconnect die; and a first encapsulant, laterally encapsulating the device die and the interconnect die disposed side by side; a second encapsulation structure, disposed on the second surface of the RDL structure, wherein the second encapsulation structure comprises a package substrate laterally encapsulated by a second encapsulant; and a memory die, bonding onto the interconnect die, wherein the memory die is electrically connected to the device die through the interconnect die and the RDL structure. In some embodiments, the topmost conductive via has a seed layer and a conductive feature on the seed layer, and the seed layer is in direct contact with a corresponding TSV. In some embodiments, further comprising a heat sink, wherein the heat sink comprises a first portion overlying a backside of the device die and having a first thickness. In some embodiments, the heat sink further comprises a second portion overlying a backside of the memory die and having a second thickness less than the first thickness. In some embodiments, the second encapsulation structure further comprises: an embedded component disposed between the package substrate and the RDL structure, wherein the embedded component is bonded onto the RDL structure and spaced from the package substrate by a non-zero distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package structure, comprising:
   laterally encapsulating a device die and an interconnect die by a first encapsulant;
   forming a redistribution layer (RDL) structure on the device die, the interconnect die, and the first encapsulant;
   bonding a package substrate onto the RDL structure, so that the RDL structure is sandwiched between the package substrate and the device die, the interconnect die, and the first encapsulant;
   laterally encapsulating the package substrate by a second encapsulant; and bonding a memory die onto the interconnect die, wherein the memory die is electrically connected to the device die through the interconnect die and the RDL structure, wherein the RDL structure comprises a first topmost conductive via directly contacting a respective pad of the device die and a second topmost conductive via directly contacting a respective substrate-through via (TSV) of the interconnect die, and the first topmost conductive via interconnects the second topmost conductive via by a same topmost conductive line.

2. The method of claim 1, wherein the laterally encapsulating the device die and the interconnect die by the first encapsulant comprises:
mounting the device die and the interconnect die on a carrier, wherein the device die has a backside toward the carrier;
forming an encapsulation material to cover the device die and the interconnect die; and
performing a planarization process to expose an active surface of the device die and a back surface of the interconnect die.

3. The method of claim 2, wherein the RDL structure comprises a redistribution layer having a plurality of conductive lines and a plurality of conductive vias, wherein the first topmost conductive via has an upper surface and a lower surface greater than the upper surface, and the upper surface is in direct contact with the respective pad of the device die.

4. The method of claim 2, wherein the RDL structure comprises a redistribution layer having a plurality of conductive lines and a plurality of conductive vias, wherein the first topmost conductive via comprises a seed layer and a conductive feature on the seed layer, and the seed layer is in direct contact with the respective pad of the device die.

5. The method of claim 1, further comprising: forming a heat sink on a backside of the device die.

6. The method of claim 5, wherein the heat sink further extends to cover a backside of the memory die.

7. The method of claim 6, wherein the heat sink is adhered onto the first encapsulant through an adhesive layer.

8. The method of claim 1, further comprising: forming an embedded component between the package substrate and the RDL structure, wherein the embedded component is bonded onto the RDL structure and spaced from the package substrate by a non-zero distance.

9. The method of claim 1, further comprising: forming a passive component aside the memory die and on the first encapsulant, wherein the passive component is electrically connected to the RDL structure through a through-molding via (TMV) in the first encapsulant.

10. A method of forming a package structure, comprising:
laterally encapsulating at least one first die by a first encapsulant;
after laterally encapsulating the at least one first die by the first encapsulant, forming a redistribution layer (RDL) structure on the at least one first die and the first encapsulant, wherein the RDL structure at least comprises: a plurality of conductive vias contacting a plurality of pad distributed on an active surface of the at least one first die, one of the plurality of conductive vias has a first surface and a second surface greater than the first surface, and the first surface is in direct contact with a corresponding pad;
bonding a package substrate onto the RDL structure, so that the RDL structure is sandwiched between the package substrate and the at least one first die, and the first encapsulant;
laterally encapsulating the package substrate by a second encapsulant; and
performing a singulation process, so that the first encapsulant, the RDL structure, and the second encapsulant have sidewalls aligned to each other.

11. The method of claim 10, wherein the at least one first die comprises a plurality of device dies, and the plurality of device dies are disposed side by side and laterally encapsulated by the first encapsulant.

12. The method of claim 11, further comprising: forming a heat sink on a backside of the plurality of device dies.

13. The method of claim 10, wherein the at least one first die comprises an extension portion, the extension portion has a plurality of substrate-through vias (TSVs) extending from a top surface of a substrate of the at least one first die to a bottom surface of the substrate of the at least one first die.

14. The method of claim 13, further comprising: bonding a second die onto the extension portion, wherein the second die is electrically connected to the package substrate through the TSVs in the extension portion and the RDL structure.

15. The method of claim 14, wherein the second die is different from the at least one first die, and the second die comprises a memory die.

16. A package structure, comprising:
a redistribution layer (RDL) structure, having a first surface and a second surface opposite to each other;
a first encapsulation structure, disposed on the first surface of the RDL structure, wherein the first encapsulation structure comprises:
a device die, having a plurality of pads distributed on an active surface of the device die, wherein the RDL structure at least comprises: a bottom metallization pattern and a top metallization pattern on the bottom metallization pattern, the top metallization pattern has a pitch less than a pitch of the bottom metallization pattern, the top metallization pattern at least comprises: a plurality of topmost conductive vias contacting the plurality of pad of the device die, one of the plurality of topmost conductive vias has an upper surface and a lower surface greater than the upper surface, and the upper surface is in direct contact with a corresponding pad;
an interconnect die, comprising a plurality of through-substrate vias (TSVs) extending from a top surface of a substrate of the interconnect die to a bottom surface of the substrate of the interconnect die; and
a first encapsulant, laterally encapsulating the device die and the interconnect die disposed side by side;
a second encapsulation structure, disposed on the second surface of the RDL structure, wherein the second encapsulation structure comprises a package substrate laterally encapsulated by a second encapsulant; and
a memory die, bonding onto the interconnect die, wherein the memory die is electrically connected to the device die through the interconnect die and the RDL structure.

17. The package structure of claim 16, wherein a first topmost conductive via of the plurality of topmost conductive vias has a seed layer and a conductive feature on the seed layer, and the seed layer is in direct contact with a corresponding TSV.

18. The package structure of claim 16, further comprising a heat sink, wherein the heat sink comprises a first portion overlying a backside of the device die and having a first thickness.

19. The package structure of claim 18, wherein the heat sink further comprises a second portion overlying a backside of the memory die and having a second thickness less than the first thickness.

20. The package structure of claim 16, wherein the second encapsulation structure further comprises: an embedded component disposed between the package substrate and the RDL structure, wherein the embedded component is bonded onto the RDL structure and spaced from the package substrate by a non-zero distance.

* * * * *